United States Patent
Tsai et al.

(10) Patent No.: US 9,698,813 B2
(45) Date of Patent: Jul. 4, 2017

(54) INPUT BUFFER AND ANALOG-TO-DIGITAL CONVERTER

(71) Applicant: MEDIATEK INC., Hsin-Chu (TW)

(72) Inventors: Chihhou Tsai, New Taipei (TW); Ying-Zu Lin, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/335,193

(22) Filed: Oct. 26, 2016

(65) Prior Publication Data

US 2017/0155399 A1    Jun. 1, 2017

Related U.S. Application Data

(60) Provisional application No. 62/261,334, filed on Dec. 1, 2015.

(51) Int. Cl.
| | | |
|---|---|---|
| *H03M 1/00* | (2006.01) | |
| *H03M 1/12* | (2006.01) | |
| *H03M 1/46* | (2006.01) | |

(52) U.S. Cl.
CPC ......... *H03M 1/1245* (2013.01); *H03M 1/462* (2013.01)

(58) Field of Classification Search
CPC ...... H03M 1/1245; H03M 1/462; H03M 1/12; H03M 1/00
USPC ........................................ 341/155, 122, 161
See application file for complete search history.

(56) References Cited

U.S. PATENT DOCUMENTS

| | | | | | |
|---|---|---|---|---|---|
| 5,291,074 | A | * | 3/1994 | Nayebi | ................ H03K 17/162 327/379 |
| 6,037,891 | A | * | 3/2000 | Griph | ................. H03M 1/0682 327/491 |
| 6,335,893 | B1 | * | 1/2002 | Tanaka | ................... G11C 5/145 257/E27.097 |
| 6,995,737 | B2 | * | 2/2006 | LeChevalier | ........ G09G 3/3216 313/463 |
| 7,079,131 | B2 | * | 7/2006 | LeChevalier | ........ G09G 3/3216 345/204 |
| 7,961,131 | B2 | * | 6/2011 | Craninckx | .......... H03M 1/0682 341/155 |

OTHER PUBLICATIONS

Baker, R.J.; "Third Edition of CMOS Circuit Design, Layout, and Simulation;" IEEE Series on Microelectronic Systems; 2010; p. 858.

* cited by examiner

*Primary Examiner* — Jean N Jeanglaude
(74) *Attorney, Agent, or Firm* — McClure, Qualey & Rodack, LLP

(57) ABSTRACT

An input buffer for an ADC is provided. The input buffer includes a receiving circuit and an impedance circuit. The receiving circuit is coupled between a power supply and a sample-and-hold circuit of the ADC, and receives an analog input signal and generating an analog signal. The impedance circuit is coupled to the receiving circuit, and selectively provides a variable impedance. When the sample-and-hold circuit of the ADC is operated in a first phase, the impedance circuit provides a small impedance, and when the sample-and-hold circuit of the ADC is operated in a second phase, the impedance circuit provides a large impedance.

20 Claims, 6 Drawing Sheets

US 9,698,813 B2

INPUT BUFFER AND ANALOG-TO-DIGITAL CONVERTER

CROSS REFERENCE TO RELATED APPLICATIONS

This Application claims priority of U.S. Provisional Application No. 62/261,334, filed on Dec. 1, 2015, the entirety of which is incorporated by reference herein.

BACKGROUND OF THE INVENTION

Field of the Invention

The invention relates to an analog-to-digital converter (ADC), and more particularly to an ADC that uses dynamic biasing techniques.

Description of the Related Art

Currently, analog-to-digital converter (ADCs) are widely used in a variety of applications, such as medical systems, audio systems, test and measurement equipment, communication systems, and image and video systems, etc. The most common ADC construction comprises flash ADCs, pipeline ADCs and successive approximation register (SAR) ADCs. Although the flash ADC and the pipeline ADC are faster than the SAR ADC, their power consumption is also larger, and are not suitable for many systems with limited power supply, such as portable devices.

Types of the SAR ADCs comprise resistor string SAR ADCs which use resistive digital to analog converters (RDACs), capacitor array SAR ADCs which use capacitive digital to analog converters (CDACs), and resistor-capacitor (R-C) hybrid SAR ADCs which use hybrid DACs (i.e. C+R DACs). In general, the capacitor array SAR ADC has better linearity than the resistor string SAR ADC. Furthermore, the R-C hybrid SAR ADC is often used to reduce area due to lengthy resistor strings or bulky capacitor arrays when physically laid out. However, large capacitance is required due to limitations in semiconductor processes, causing larger area and increasing power consumption.

Therefore, it is desired to decrease power consumption for the SAR ADCs.

BRIEF SUMMARY OF THE INVENTION

An input buffer and an analog-to-digital converter (ADC) are provided. An embodiment of an input buffer for an ADC is provided. The input buffer comprises a receiving circuit and an impedance circuit. The receiving circuit is coupled between a power supply and a sample-and-hold circuit of the ADC, and receives an analog input signal and generating an analog signal. The impedance circuit is coupled to the receiving circuit, and selectively provides a variable impedance. When the sample-and-hold circuit of the ADC is operated in a first phase, the impedance circuit provides a small impedance, and when the sample-and-hold circuit of the ADC is operated in a second phase, the impedance circuit provides a large impedance.

Furthermore, an embodiment of an analog-to-digital converter (ADC) for converting an analog input signal into a digital output signal is provided. The ADC comprises an input buffer and a successive approximation register (SAR) ADC. The input buffer receives the analog input signal to provide an analog signal. The SAR ADC comprises a sample-and-hold circuit coupled to the input buffer, a digital to analog converter, a comparator, and a SAR logic. The sample-and-hold circuit samples the analog signal in a first phase and stores the sampled analog signal in a second phase. The digital to analog converter provides an intermediate analog signal according to a plurality of control signals and a reference voltage in a comparison phase. The comparator provides a comparison result according to the intermediate analog signal and the stored analog signal. The SAR logic provides the digital output signal and the control signals according to the comparison result. The input buffer comprises a receiving circuit coupled between a power supply and the sample-and-hold circuit of the SAR ADC, and a first impedance circuit coupled to the receiving circuit. The receiving circuit receives the analog input signal and generates an analog signal. The first impedance circuit selectively provides a first variable impedance. In the first phase, the first impedance circuit provides a small impedance, and in the second phase, the first impedance circuit provides a large impedance.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
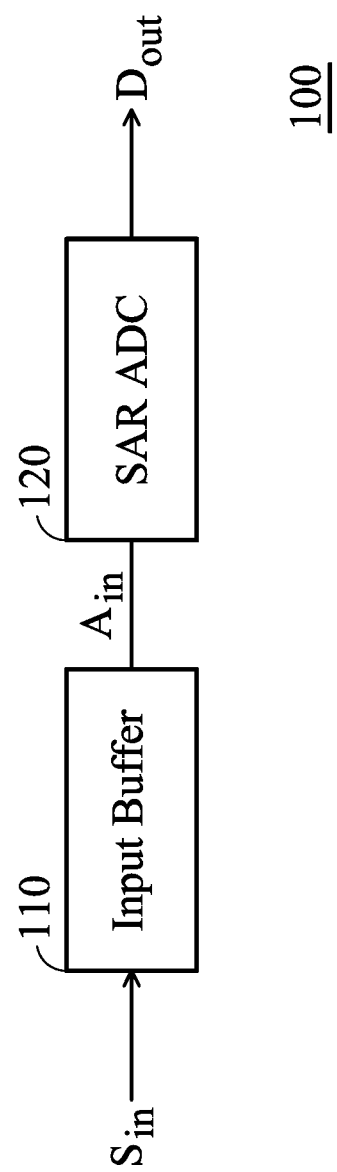
FIG. 1 shows an analog-to-digital converter (ADC) according to an embodiment of the invention.

FIG. 1 shows an analog-to-digital converter (ADC) 100 according to an embodiment of the invention. The ADC 100 comprises an input buffer 110 and a successive approximation register (SAR) ADC 120. The input buffer 110 is capable of receiving (or amplifying) an analog input signal $S_{in}$ and providing an analog signal $A_{in}$. The SAR ADC 120 is capable of providing a digital output signal $D_{out}$ representative of the strength of the analog signal $A_{in}$ (at a sampled time instance) through a binary search process through all possible quantization levels. In some embodiments, the input buffer 110 is a driver for other types of ADCs.

Figure 2A:
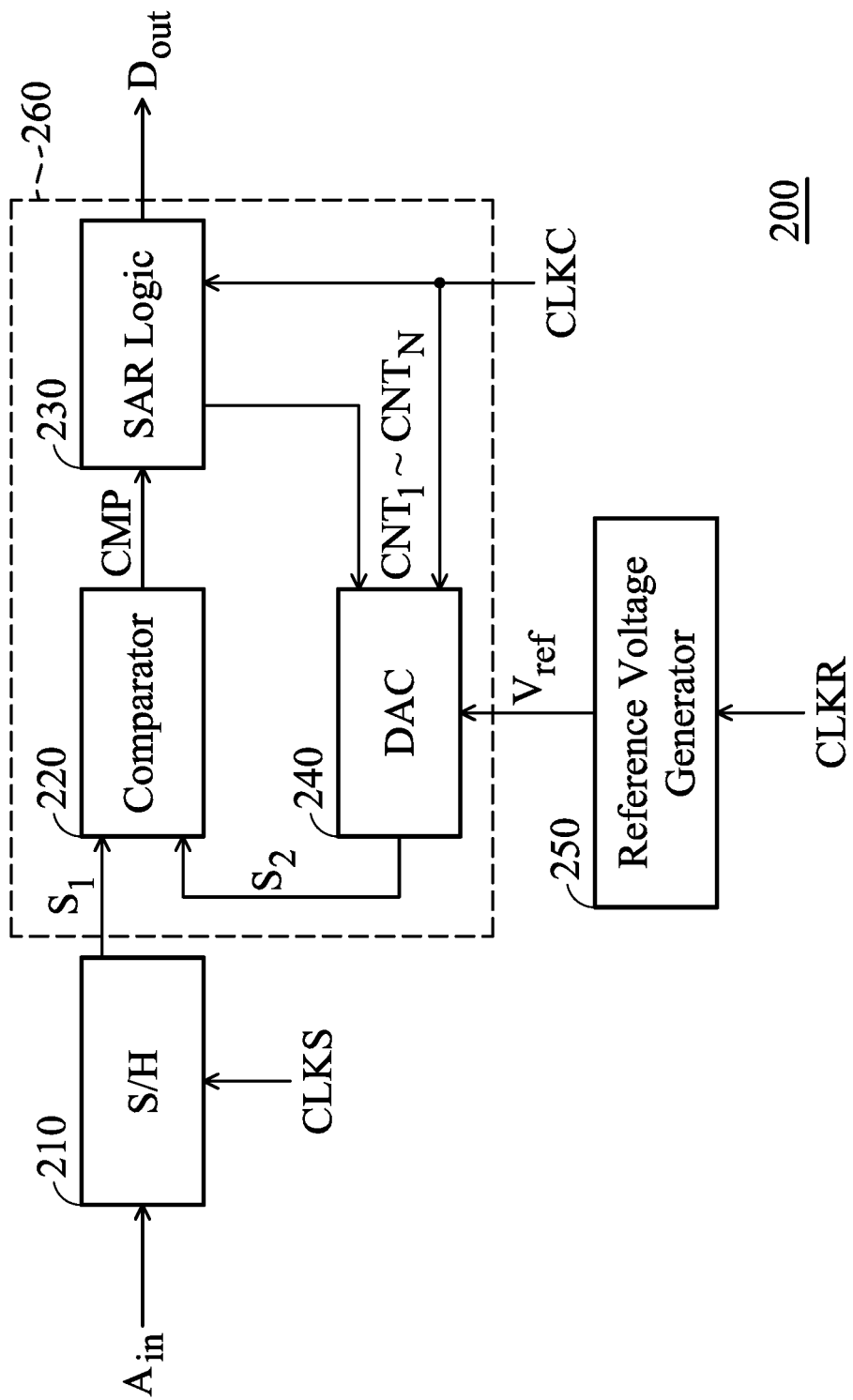
FIG. 2A shows a successive approximation register (SAR) ADC according to an embodiment of the invention.

FIG. 2A shows a SAR ADC 200 according to an embodiment of the invention. The SAR ADC 200 comprises a sample and hold (S/H) circuit 210, a converting circuit 260, and a reference voltage generator 250. In the embodiment, the converting circuit 260 comprises a comparator 220, a SAR logic 230, and a digital to analog converter (DAC) 240. It should be noted that the converting circuit 260 is used as an example, and is not meant to limit the invention. In other embodiments, other types of ADC circuits can be implemented in the SAR ADC 200. The sample-and-hold circuit 210 samples the analog signal $A_{in}$ to obtain a sampled analog signal $S_1$ according to a clock signal CLKS. The DAC 240 generates an intermediate analog signal $S_2$ according to a clock signal CLKC, a reference voltage $V_{ref}$ from the reference voltage generator 250 and a plurality of control signals $CNT_1$ to $CNT_N$ from the SAR logic 230. The comparator 220 provides a comparison result CMP according to the sampled analog signal $S_1$ and the intermediate analog signal $S_2$. The SAR logic 230 provides a digital output signal $D_{out}$ according to the comparison result CMP. Furthermore, the SAR logic 230 provides the control signals $CNT_1$ to $CNT_N$ to the DAC 240 according to the comparison result CMP and the clock signal CLKC. The reference voltage generator 250 provides the reference voltage $V_{ref}$ according to a clock signal CLKR.

Figure 2B:
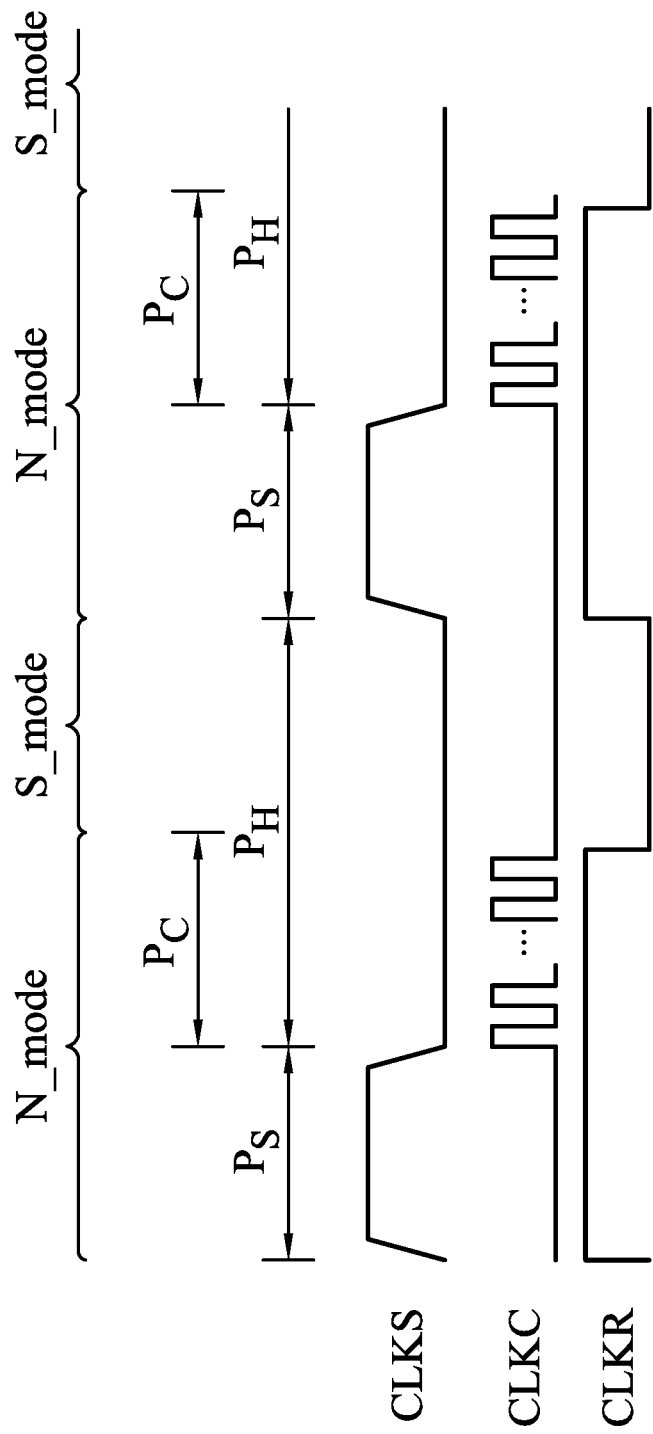
FIG. 2B shows an example illustrating the clock signals CLKS, CLKC and CLKR of the SAR ADC of FIG. 2A according to an embodiment of the invention.

FIG. 2B shows an example illustrating the clock signals CLKS, CLKC and CLKR of the SAR ADC 200 of FIG. 2A according to an embodiment of the invention. Referring to FIG. 2A and FIG. 2B together, in a normal mode N_mode, the SAR ADC 200 is capable of receiving the analog signal $A_{in}$ and providing the digital output signal $D_{out}$ corresponding to the analog signal $A_{in}$. In a standby mode S_mode, the SAR ADC 200 is idling, and no digital output signal $D_{out}$ is provided. If the clock signal CLKR is active, the SAR ADC 200 is operating in the normal mode N_mode. If the clock signal CLKR is inactive, the SAR ADC 200 is operating in the standby mode S_mode. Furthermore, if the clock signal CLKS is active, the sample-and-hold circuit 210 is in a sampling phase $P_S$, and the analog signal $A_{in}$ is sampled by the sample-and-hold circuit 210. If the clock signal CLKS is inactive, the sample-and-hold circuit 210 is in a hold phase $P_H$, and the sampled analog signal $A_{in}$ is held by the sample-and-hold circuit 210. Moreover, according to the comparison result CMP, each bit of the digital output signal $D_{out}$ is determined by the SAR logic 230 in a comparison phase $P_C$, starting from a most significant bit (MSB). For example, to determine the most significant bit, the SAR logic 230 sets the most significant bit control signal $CNT_1$ to a first logic value (e.g. "1") and sets the significant control signals $CNT_2$ to $CNT_N$ to a second logic value (e.g. "0"). Then, the DAC 240 generates the intermediate analog signal $S_2$ according to the clock signal CLKC in response to the control signals $CNT_1$ to $CNT_N$ in the comparison phase $P_C$. Assuming the first logic value equals "1", the value of the most significant bit of the digital output signal $D_{out}$ is determined to equal "0" by the SAR logic 230 when the comparison result CMP indicates that the sampled analog signal $S_1$ is smaller than the intermediate analog signal $S_2$, or else to "1". After the most significant bit of the digital output signal $D_{out}$ is determined, the SAR logic 230 sets the next significant control signal $CNT_2$ to "1" and sets the following significant control signals $CNT_3$ to $CNT_N$ to "0", and then the DAC 240 generates a new intermediate analog signal $S_2$ according to the clock signal CLKC in the comparison phase $P_C$. Similarly, the SAR logic 230 determines the next significant bit of the digital output signal $D_{out}$ according to a new comparison result CMP. The approach is continued until all the bits of the digital output signal $D_{out}$ are determined. It should be noted that the setting of the control signals $CNT_1$ to $CNT_N$ is an example, and not to limit the invention. Furthermore, in the embodiment, when the clock signal CLKS is active and the clock signal CLKR is inactive, the SAR ADC 200 is operated in a non-comparison phase.

Figure 3:
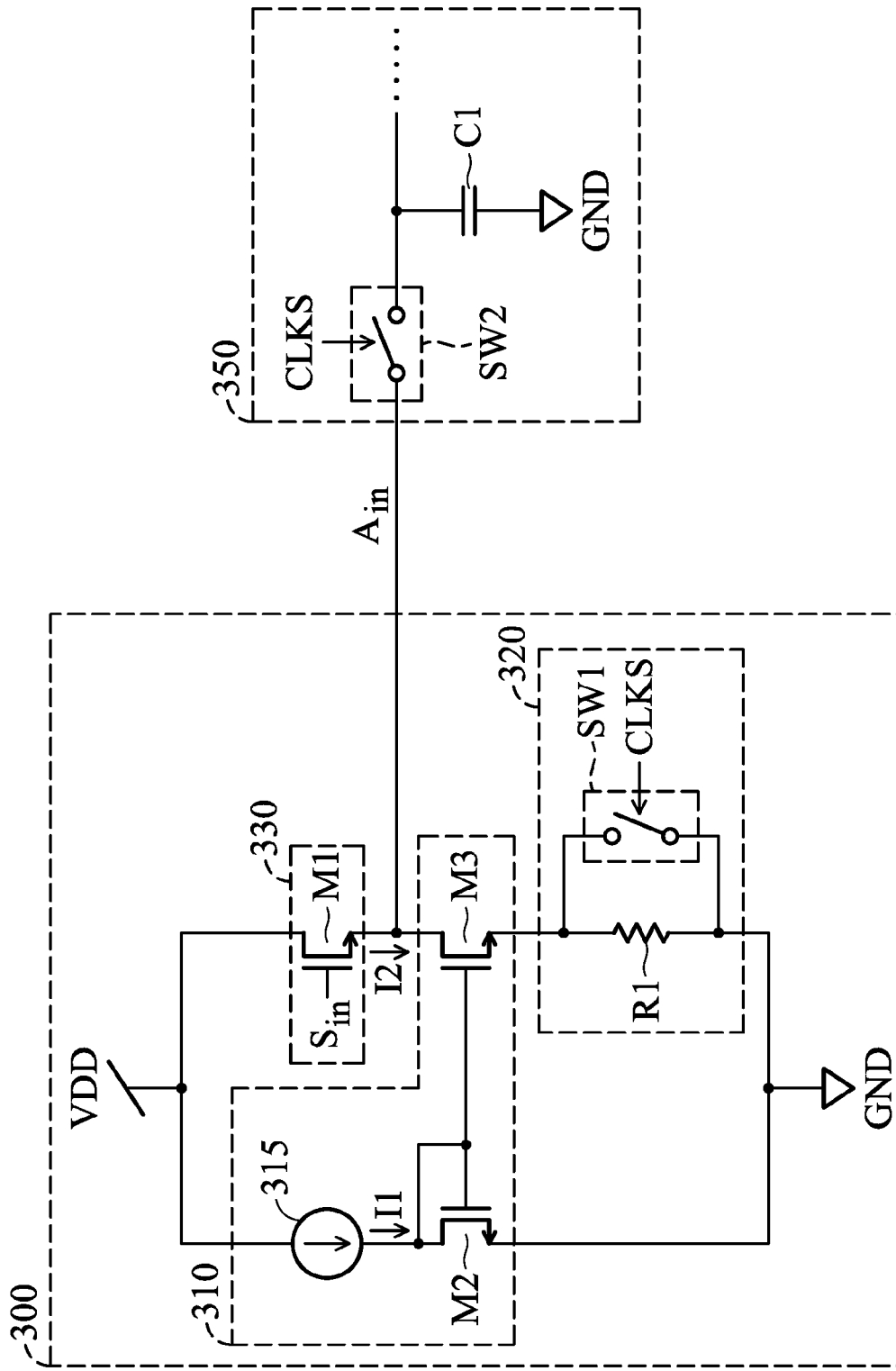
FIG. 3 shows an input buffer according to an embodiment of the invention.

FIG. 3 shows an input buffer 300 according to an embodiment of the invention. According to an analog input signal $S_{in}$, the input buffer 300 is capable of providing an analog signal $A_{in}$ to a sample-and-hold circuit 350 of a SAR ADC. The input buffer 300 comprises a bias circuit 310, a receiving circuit 330, and an impedance circuit 320. In the embodiment, the receiving circuit 330 comprises an NMOS transistor M1. The NMOS transistor M1 is coupled between a power supply VDD and the sample-and-hold circuit 350, and a gate of the NMOS transistor M1 is used to receive the analog input signal $S_{in}$. In the embodiment, the NMOS transistor M1 is a source follower with high input impedance and low output impedance. It should be noted that the NMOS transistor M1 is used as an example, and is not meant to limit the invention. In other embodiments, the receiving circuit 330 may comprise a PMOS transistor. The bias circuit 310 is coupled between the NMOS transistor M1 and the impedance circuit 320, and comprises a current source 315 and the NMOS transistors M2 and M3. The current source 315 is coupled between the power supply VDD and the NMOS transistor M2, and the current source 315 is capable of providing a current I1 to the NMOS transistor M2. The NMOS transistor M2 is coupled between the current source 315 and a ground GND, and a gate of the NMOS transistor M2 is coupled to the current source 315. The NMOS transistor M3 is coupled between the NMOS transistor M1 and the impedance circuit 320, and a gate of the NMOS transistor M3 is coupled to the current source 315 and the gate of the NMOS transistor M2. The impedance circuit 320 comprises a resistive circuit and a switching circuit. The resistive circuit comprises a resistor R1, and the resistor R1 is coupled between the NMOS transistor M3 and the ground GND. The switching circuit comprises a switch SW1, wherein the switch SW1 is coupled to the resistor R1 in parallel, and the switch SW1 is controlled by a clock signal CLKS of the SAR ADC. In response to the clock signal CLKS, the impedance circuit 320 selectively provides a variable impedance. For example, in a sampling phase $P_S$ of the SAR ADC, the switch SW1 is turned on by the clock signal CLKS, and the NMOS transistor M3 is coupled to the ground GND via the switch SW1 and the resistor R1 connected in parallel. Therefore, the impedance circuit 320 provides a small impedance (e.g. a turn-on equivalent resistance of the switch SW1) in the sampling phase $P_S$ of the SAR ADC, and then the bias circuit 310 drains a large current I2 corresponding to the analog input signal $S_{in}$ from the NMOS transistor M1 in response to the small impedance. Conversely, in a hold phase $P_H$ of the SAR ADC, the switch SW1 is turned off by the clock signal CLKS, and the NMOS transistor M3 is coupled to the ground GND only via the resistor R1. Therefore, the impedance circuit 320 provides a large impedance (e.g. the resistance of the resistor R1) in the hold phase $P_H$ of the SAR ADC, and then the bias circuit 310 drains a small current I2 corresponding to the analog input signal $S_{in}$ from the NMOS transistor M1 in response to the large impedance. Thus, the total current of the input buffer 300 is decreased in the hold phase $P_H$, thereby power consumption is also decreased in a normal mode of the SAR ADC. In some embodiments, the impedance circuit 320 may be a variable resistor.

Figure 4:
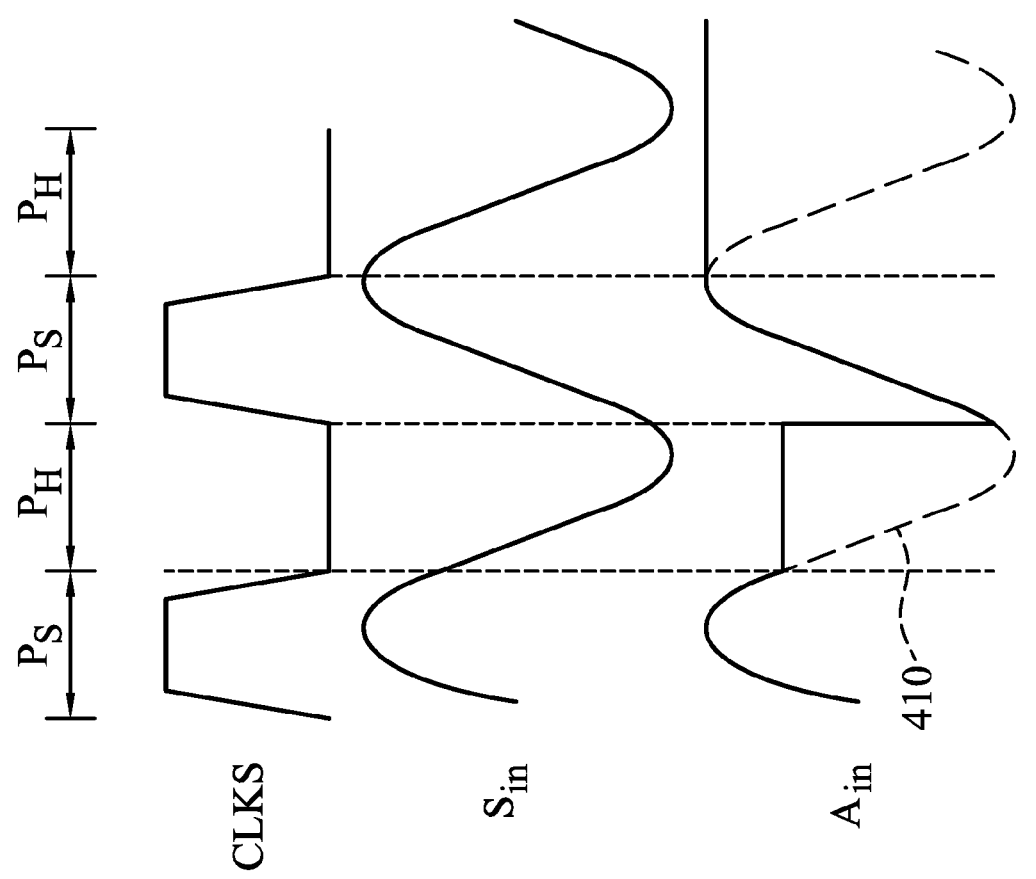
FIG. 4 shows an example illustrating a waveform of the signals of FIG. 3 according to an embodiment of the invention.

FIG. 4 shows an example illustrating a waveform of the signals of FIG. 3 according to an embodiment of the invention. Referring to FIG. 3 and FIG. 4 together, the sample-and-hold circuit 350 comprises a switch SW2 and a capacitor C1, wherein the switch SW2 is also controlled by the clock signal CLKS. In a sampling phase $P_S$ of the SAR ADC, the switch SW2 is turned on by the clock signal CLKS, and the analog signal $A_{in}$ is transmitted to the capacitor C1 via the switch SW2. In a hold phase $P_H$ of the SAR ADC, the switch SW2 is turned off by the clock signal CLKS, and the transmitted analog signal $A_{in}$ is stored in the capacitor C1. In order to simplify description, detail of the sample-and-hold circuit 350 will not be described. As described above, the switches SW1 and SW2 are turned on in the sampling phase $P_S$, and the switches SW1 and SW2 are turned off in the hold phase $P_H$. Thus, the analog signal $A_{in}$ can track the analog input signal $S_{in}$ in the sampling phase $P_S$, and hold the tracked analog input signal $S_{in}$ in the hold phase $P_H$. For example, in the hold phase $P_H$, the analog input signal $S_{in}$ will not be tracked for the analog signal $A_{in}$, e.g. labeled as 410.

Figure 5:
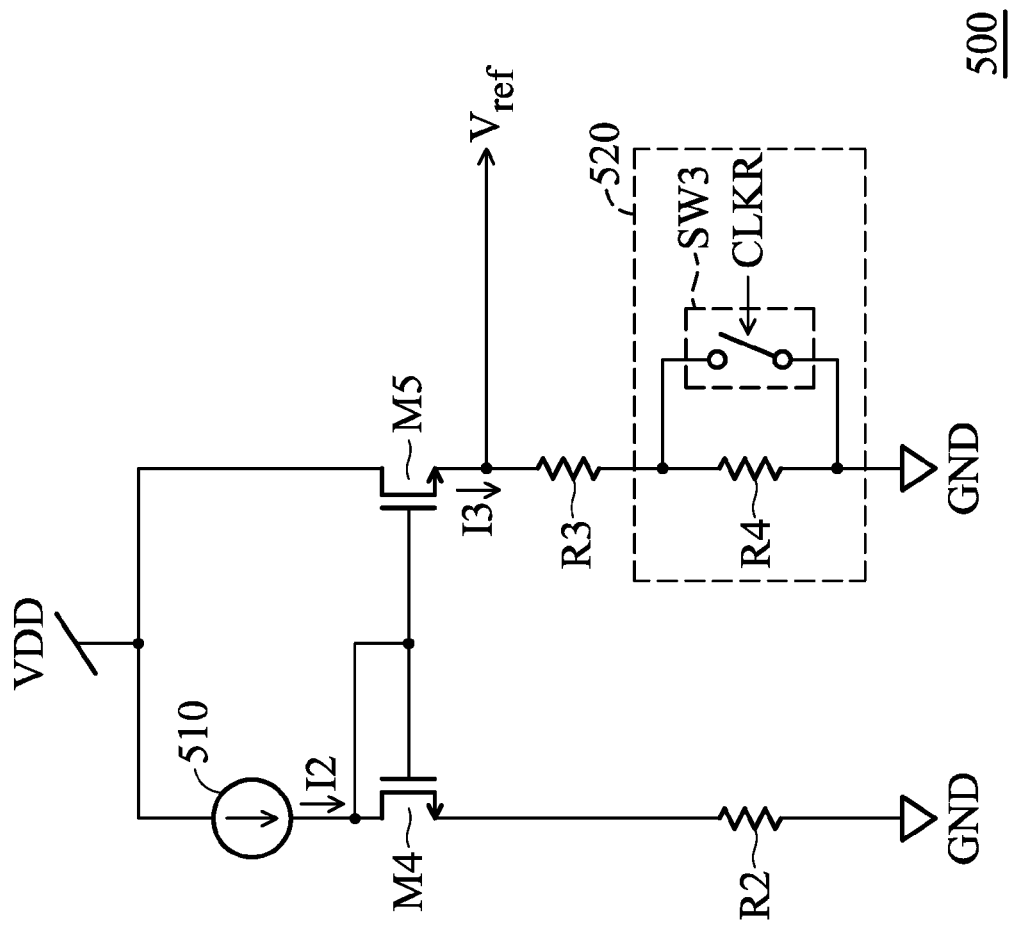
FIG. 5 shows a reference voltage generator of a SAR ADC according to an embodiment of the invention.

FIG. 5 shows a reference voltage generator 500 of a SAR ADC according to an embodiment of the invention. The reference voltage generator 500 comprises a current source 510, two NMOS transistors M4 and M5, two resistors R2 and R3, and an impedance circuit 520. The current source 510 is coupled between the power supply VDD and the NMOS transistor M4, and the current source 510 is capable of providing a current I2 to the NMOS transistor M4. The NMOS transistor M4 is coupled between the current source 510 and the resistor R2, and a gate of the NMOS transistor M4 is coupled to the current source 510. The resistor R2 is coupled between the NMOS transistor M4 and the ground GND. The NMOS transistor M5 is coupled between the power supply VDD and the resistor R3, and a gate of the NMOS transistor M5 is coupled to the current source 510 and the gate of the NMOS transistor M4. The resistor R3 is coupled between the NMOS transistor M5 and the impedance circuit 520. The impedance circuit 520 comprises a resistive circuit and a switching circuit. The resistive circuit comprises a resistor R4, and the resistor R4 is coupled between the resistor R3 and the ground GND. The switching circuit comprises a switch SW3, wherein the switch SW3 is coupled to the resistor R4 in parallel, and the switch SW3 is controlled by a clock signal CLKR of the SAR ADC. In response to the clock signal CLKR, the impedance circuit 520 selectively provides a variable impedance. For example, in a normal mode N_mode of the SAR ADC, the switch SW3 is turned on by the clock signal CLKR, and the resistor R3 is coupled to the ground GND via the switch SW3 and the resistor R4 connected in parallel. Therefore, the impedance circuit 520 provides a small impedance (e.g. a turn-on equivalent resistance of the switch SW3) in the normal mode N_mode of the SAR ADC, and then a large current I3 is drained from the NMOS transistor M5 in response to the small impedance. Conversely, in a standby mode S_mode of the SAR ADC, the switch SW3 is turned off by the clock signal CLKR, and the resistor R3 is coupled to the ground GND only via the resistor R4. Therefore, the impedance circuit 520 provides a large impedance (e.g. the resistance of the resistor R4) in the hold phase $P_H$ of the SAR ADC, and then a small current I3 is drained from the NMOS transistor M5 in response to the large impedance. Thus, the total current of the reference voltage generator 500 is decreased in the standby mode S_mode of the SAR ADC, thereby power consumption is also decreased for the SAR ADC. In some embodiments, the impedance circuit 520 may be a variable resistor.

According to the embodiments, by switching the switches (e.g. SW1 of FIG. 3 and/or SW3 of FIG. 5) in the impedance circuits 320 and 520 according to the corresponding clock signals, the current flowing through each impedance circuit is adjusted, thereby dynamically biasing the average current for the ADC.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input buffer for an analog-to-digital converter (ADC), comprising:
    a receiving circuit coupled between a power supply and a sample-and-hold circuit of the ADC, for receiving an analog input signal and generating an analog signal; and
    an impedance circuit coupled to the receiving circuit, for selectively providing a variable impedance;
    wherein when the sample-and-hold circuit of the ADC is operated in a first phase, the impedance circuit provides a small impedance, and when the sample-and-hold circuit of the ADC is operated in a second phase, the impedance circuit provides a large impedance.

2. The input buffer as claimed in claim 1, wherein the impedance circuit comprises:
    a resistive circuit coupled to the receiving circuit; and
    a first switching circuit coupled to the resistive circuit in parallel,
    wherein the first switching circuit is turned on when the sample-and-hold circuit of the ADC is operated in the first phase, and the first switching circuit is turned off when the sample-and-hold circuit of the ADC is operated in the second phase.

3. The input buffer as claimed in claim 1, wherein the impedance circuit comprises a variable resistor.

4. The input buffer as claimed in claim 1, further comprising:
    a bias circuit coupled to the impedance circuit and the receiving circuit, for draining a current from the receiving circuit in response to the variable impedance of the impedance circuit.

5. The input buffer as claimed in claim 4, wherein the bias circuit comprises:
    a current source coupled to the power supply;
    a first transistor coupled in series to the current source; and
    a second transistor coupled to the receiving circuit and the impedance circuit, having a gate coupled to the current source and the gate of the first transistor.

6. The input buffer as claimed in claim 5, wherein the impedance circuit comprises:
    a resistive circuit coupled to the second transistor; and
    a first switching circuit coupled to the resistive circuit in parallel,
    wherein when the sample-and-hold circuit of the ADC is operated in the first phase, the first switching circuit is turned on,
    wherein when the sample-and-hold circuit of the ADC is operated in the second phase, the first switching circuit is turned off.

7. The input buffer as claimed in claim 5, wherein the impedance circuit comprises a variable resistor.

8. The input buffer as claimed in claim 1, wherein the sample-and-hold circuit of the ADC comprises:
    a capacitor coupled to the receiving circuit; and
    a second switching circuit coupled between the capacitor and the receiving circuit;

wherein when the sample-and-hold circuit of the ADC is operated in the first phase, the second switching circuit is turned on, and a voltage corresponding to the analog signal from the receiving circuit is stored in the capacitor via the second switching circuit;

wherein when the sample-and-hold circuit of the ADC is operated in the second phase, the second switching circuit is turned off.

9. An analog-to-digital converter (ADC) for converting an analog input signal into a digital output signal, comprising:
an input buffer, receiving the analog input signal to provide an analog signal; and
a successive approximation register (SAR) ADC, comprising:
a sample-and-hold circuit coupled to the input buffer, for sampling the analog signal in a first phase and storing the sampled analog signal in a second phase;
a digital-to-analog converter, for providing an intermediate analog signal according to a plurality of control signals and a reference voltage in a comparison phase;
a comparator, for providing a comparison result according to the intermediate analog signal and the stored analog signal; and
a SAR logic, for providing the digital output signal and the control signals according to the comparison result,
wherein the input buffer comprises:
a receiving circuit coupled between a power supply and the sample-and-hold circuit of the SAR ADC, for receiving the analog input signal and generating the analog signal; and
a first impedance circuit coupled to the receiving circuit, for selectively providing a first variable impedance;
wherein in the first phase, the first impedance circuit provides a small impedance, and in the second phase, the first impedance circuit provides a large impedance.

10. The ADC as claimed in claim 9, wherein the first impedance circuit comprises:
a first resistive circuit coupled to the receiving circuit; and
a first switching circuit coupled to the first resistive circuit in parallel,
wherein the first switching circuit is turned on in the first phase, and the first switching circuit is turned off in the second phase.

11. The ADC as claimed in claim 9, wherein the first impedance circuit comprises a variable resistor.

12. The ADC as claimed in claim 9, wherein the input buffer further comprises:
a bias circuit coupled to the first impedance circuit and the receiving circuit, for draining a current from the receiving circuit in response to the first variable impedance of the first impedance circuit.

13. The ADC as claimed in claim 12, wherein the bias circuit comprises:
a first current source coupled to the power supply;

a first transistor coupled in series to the first current source; and
a second transistor coupled to the receiving circuit and the first impedance circuit, having a gate coupled to the first current source and the gate of the first transistor.

14. The ADC as claimed in claim 13, wherein the first impedance circuit comprises:
a first resistive circuit coupled to the second transistor; and
a first switching circuit coupled to the first resistive circuit in parallel,
wherein the first switching circuit is turned on in the first phase, and the first switching circuit is turned off in the second phase.

15. The ADC as claimed in claim 13, wherein the first impedance circuit comprises a variable resistor.

16. The ADC as claimed in claim 9, wherein the sample-and-hold circuit comprises:
a capacitor coupled to the receiving circuit; and
a second switching circuit coupled between the capacitor and the receiving circuit,
wherein the second switching circuit is turned on in the first phase, and a voltage corresponding to the analog signal from the receiving circuit is stored in the capacitor via the second switching circuit,
wherein the second switching circuit is turned off in the second phase.

17. The ADC as claimed in claim 9, further comprising:
a reference voltage generator, providing the reference voltage, and comprising:
a second current source coupled to the power supply;
a second resistive circuit coupled to a ground;
a third transistor coupled between the second current source and the second resistive circuit;
a fourth transistor coupled to the power supply, having a gate coupled to the second current source and a gate of the third transistor;
a second impedance circuit coupled to the fourth transistor, for selectively providing a second variable impedance; and
a third resistive circuit coupled between the fourth transistor and the second impedance circuit.

18. The ADC as claimed in claim 17, wherein the second impedance circuit provides a small impedance in the comparison phase, and the impedance circuit provides a large impedance in a non-comparison phase.

19. The ADC as claimed in claim 17, wherein the second impedance circuit comprises:
a fourth resistive circuit coupled to the third resistive circuit; and
a third switching circuit coupled to the fourth resistive circuit in parallel,
wherein the third switching circuit is turned on in the comparison phase, and the third switching circuit is turned off in a non-comparison phase.

20. The ADC as claimed in claim 18, wherein the second impedance circuit comprises a variable resistor.

* * * * *